United States Patent
Gong et al.

(10) Patent No.: US 12,149,235 B2
(45) Date of Patent: Nov. 19, 2024

(54) RADIO FREQUENCY SWITCH

(71) Applicant: SAMSUNG ELECTRO-MECHANICS CO., LTD., Suwon-si (KR)

(72) Inventors: Jungchul Gong, Suwon-si (KR); Jooyul Ko, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 18/114,403

(22) Filed: Feb. 27, 2023

(65) Prior Publication Data

US 2023/0421150 A1 Dec. 28, 2023

(30) Foreign Application Priority Data

Jun. 24, 2022 (KR) .......................... 10-2022-0077649
Nov. 23, 2022 (KR) .......................... 10-2022-0158124

(51) Int. Cl.
*H03K 17/16* (2006.01)

(52) U.S. Cl.
CPC .................................. *H03K 17/165* (2013.01)

(58) Field of Classification Search
None
See application file for complete search history.

(56) References Cited

U.S. PATENT DOCUMENTS

| | | | |
|---|---|---|---|
| 9,203,396 B1 | 12/2015 | Clausen et al. | |
| 9,628,075 B2* | 4/2017 | Cebi | H01L 27/1203 |
| 10,110,271 B2 | 10/2018 | Li et al. | |
| 10,277,222 B1* | 4/2019 | Maxim | H04B 1/40 |
| 10,541,682 B2* | 1/2020 | Popplewell | H01L 29/78603 |
| 10,659,031 B2 | 5/2020 | Franck et al. | |
| 10,715,133 B1* | 7/2020 | Scott | H03K 17/161 |
| 11,683,028 B2* | 6/2023 | Malladi | H04B 1/44 |
| | | | 327/109 |
| 2023/0318597 A1* | 10/2023 | Jo | H03K 17/063 |
| | | | 327/108 |

* cited by examiner

*Primary Examiner* — Jeffrey S Zweizig
(74) *Attorney, Agent, or Firm* — NSIP Law

(57) ABSTRACT

A radio frequency (RF) switch is provided. The RF switch includes: a switch transistor that includes a first terminal to which a radio frequency (RF) signal is input, a second terminal to which the RF signal is output, a control terminal to which a first level voltage and a second level voltage are applied in response to a control signal, and a body terminal to which a bias voltage is applied; and a bias switch connected between the control terminal and the body terminal of the switch transistor and configured to turn on when the switch transistor is turned off to apply the second level voltage to the body terminal.

9 Claims, 14 Drawing Sheets

RADIO FREQUENCY SWITCH

CROSS-REFERENCE TO RELATED APPLICATIONS

This application claims the benefit under 35 USC § 119(a) of Korean Patent Application No. 10-2022-0158124, filed on Nov. 23, 2022, and Korean Patent Application No. 10-2022-0077649 filed on Jun. 24, 2022, in the Korean Intellectual Property Office, the entire disclosures of which are incorporated herein by reference for all purposes.

BACKGROUND

1. Field

The following description relates to a radio frequency (RF) switch.

2. Description of Related Art

A radio frequency (RF) switch may implement various frequencies such as, but not limited to, a global system for mobile communications (GSM) frequency, a wideband code division multiple access (WCDMA) frequency, a long term evolution (LTE) frequency, and the like in wireless communication devices such as, but not limited to, a smartphone and a tablet.

By implementing a high-resistance substrate, the RF switch may use a complementary metal oxide semiconductor (CMOS) circuit that uses a silicon on insulator (SOI) metal oxide semiconductor field effect transistor (MOSFET) instead of gallium arsenide (GaAs) technology, so that it may have a reduced size and may use a low battery voltage.

The RF power of the RF switch has gradually increased. Therefore, in order to withstand a high withstanding voltage, two or more MOSFETs may be stacked in series to form the RF switch. However, the stacking or configuring of a plurality of MOSFETs in series may result in an increase in series resistance, which may increase RF insertion loss. In order to solve this problem, a size of a MOSFET should be increased, but this causes a problem in which parasitic capacitance increases and a chip size also increases.

An appropriate voltage may be applied to a gate terminal and a body terminal of the MOSFET to reduce parasitic capacitance and to reduce a chip size. However, there is a limit to improving the above problem as the RF power increases.

The above information disclosed in this Background section is only for enhancement of understanding of the background of the described technology, and therefore it may contain information that does not constitute prior art or knowledge.

SUMMARY

This Summary is provided to introduce a selection of concepts in a simplified form that is further described below in the Detailed Description. This Summary is not intended to identify key features or essential features of the claimed subject matter, nor is it intended to be used as an aid in determining the scope of the claimed subject matter.

In a general aspect a radio frequency (RF) switch, includes a switch transistor comprising a first terminal to which a radio frequency (RF) signal is input, a second terminal to which the RF signal is output, a control terminal to which a first level voltage and a second level voltage are applied in response to a control signal, and a body terminal to which a bias voltage is applied; and a bias switch, connected between the control terminal and the body terminal of the switch transistor, and configured to turn on when the switch transistor is turned off to apply the second level voltage to the body terminal.

The second level voltage may be a negative voltage.

Each of the switch transistor and the bias switch may be an N-type field effect transistor (FET), and a control terminal of the bias switch is connected to a ground terminal.

The RF switch may further include an inverter that is configured to invert the control signal, wherein each of the switch transistor and the bias switch may be an N-type field effect transistor (FET), and the bias switch may be turned on or turned off in response to the inverted control signal.

The switch transistor may be an N-type field effect transistor (FET), and the bias switch is a P-type FET.

The bias switch may be configured to turn on or turn off based on a bias control signal, and the bias control signal may be synchronized with the control signal and has an opposite phase to a phase of the control signal.

In a general aspect, an RF switch includes a plurality of first switch transistors, connected in series between a first port and a second port, the plurality of first switch transistors comprising: a first drain terminal to which a radio frequency (RF) signal is input, a first source terminal to which the RF signal is output, a first gate terminal to which at least one of a positive voltage and a negative voltage is applied in response to a gate control signal, and a first body terminal to which a bias voltage is applied; and a plurality of first bias switches connected between the first gate terminal and the first body terminal of each of the plurality of first switch transistors, wherein the plurality of first bias switches are configured to turn on when the plurality of first switch transistors are turned off and apply the negative voltage to the first body terminal.

The plurality of first switch transistors and the plurality of first bias switches are N-type field effect transistors (FETs), and gate terminals of the plurality of first bias switches are connected to a ground terminal.

The RF switch may further include an inverter that is configured to invert the gate control signal, wherein the plurality of first bias switches are configured to turn on or turn off in response to a gate control signal that is inverted by the inverter, and wherein the plurality of first switch transistors and the plurality of first bias switches are N-type field effect transistors (FETs).

The plurality of first switch transistors may be N-type field effect transistors (FETs), and the first bias switches are P-type FETs.

The first bias switches may be configured to turn on or turn off based on a bias control signal, and the bias control signal is synchronized with the gate control signal and has an opposite phase to a phase of the gate control signal.

The RF switch may further include a plurality of second switch transistors that are connected in series between the second port and a ground, and that are configured to turn off when the plurality of first switch transistors are turned on.

The RF switch may further include a plurality of second bias switches that may be connected between a second gate terminal and a second body terminal of each of the plurality of second switch transistors and that may be configured to apply the negative voltage to the second body terminal when the plurality of second bias switches are turned on when the plurality of second switch transistors are turned off, wherein the plurality of second switch transistors may respectively include a second drain terminal, a second source terminal, the second gate terminal to which the negative voltage or the positive voltage is applied in response to an inversion signal of the gate control signal, and the second body terminal.

In a general aspect, a radio frequency (RF) switch includes a first switch including a gate terminal, a source terminal, and a body terminal; a second switch, connected between the gate terminal of the first switch, the body terminal of the first switch, and configured to turn on based on an off state of the first switch, wherein, in response to a control signal, the RF switch is configured to transmit a negative voltage to the body terminal and the gate terminal of the first switch when the first switch is turned off.

A gate terminal of the second switch may be connected to one of an inverter and a ground terminal.

The first switch may be a N-type field effect transistor (FET) and the second switch may be one of an N-type FET and a P-type FET.

Other features and aspects will be apparent from the following detailed description, the drawings, and the claims.

BRIEF DESCRIPTION OF DRAWINGS

Throughout the drawings and the detailed description, the same reference numerals may refer to the same, or like, elements. The drawings may not be to scale, and the relative size, proportions, and depiction of elements in the drawings may be exaggerated for clarity, illustration, and convenience.

DETAILED DESCRIPTION

Figure 1:
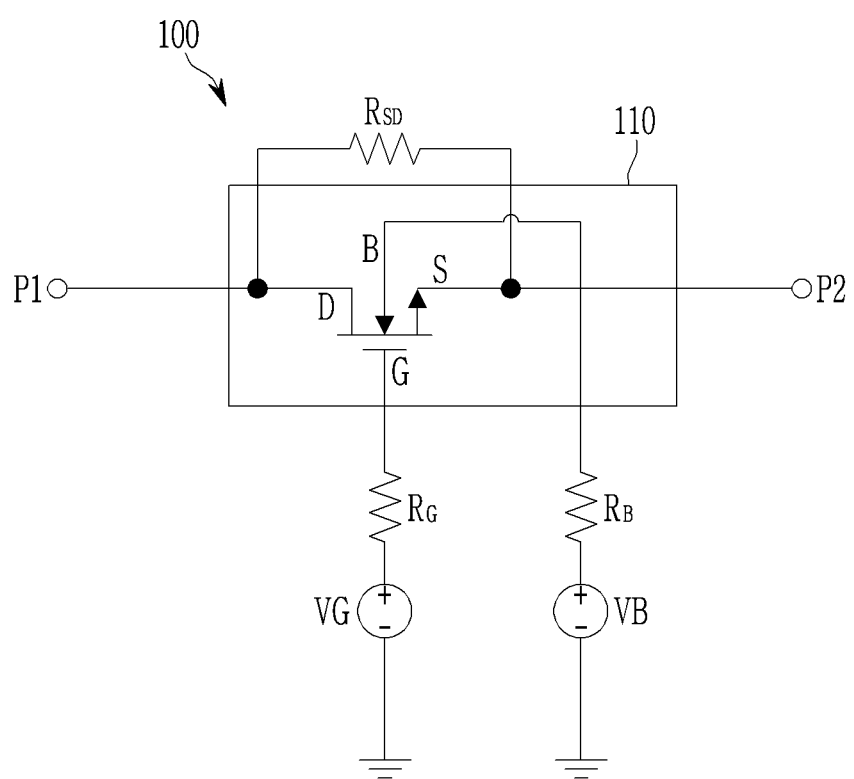
FIG. 1 illustrates an example radio frequency (RF) switch implementing a general floating body bias method, in accordance with one or more embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known, after an understanding of the disclosure of this application, may be omitted for increased clarity and conciseness, noting that omissions of features and their descriptions are also not intended to be admissions of their general knowledge.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. Likewise, expressions, for example, "between" and "immediately between" and "adjacent to" and "immediately adjacent to" may also be construed as described in the foregoing.

The terminology used herein is for the purpose of describing particular examples only, and is not to be used to limit the disclosure. As used herein, the singular forms "a," "an," and "the" are intended to include the plural forms as well, unless the context clearly indicates otherwise. As used herein, the term "and/or" includes any one and any combination of any two or more of the associated listed items. As used herein, the terms "include," "comprise," and "have" specify the presence of stated features, numbers, operations, elements, components, and/or combinations thereof, but do not preclude the presence or addition of one or more other features, numbers, operations, elements, components, and/or combinations thereof. The use of the term "may" herein with respect to an example or embodiment (for example, as to what an example or embodiment may include or implement) means that at least one example or embodiment exists where such a feature is included or implemented, while all examples are not limited thereto.

Unless otherwise defined, all terms, including technical and scientific terms, used herein have the same meaning as commonly understood by one of ordinary skill in the art to which this disclosure pertains consistent with and after an understanding of the present disclosure. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

Throughout the specification, the radio frequency (RF) signal may have a format according to other random wireless and wired protocols designated by, as only examples, Wi-Fi (IEEE 802.11 family, etc.), WiMAX (IEEE 802.16 family, etc.), IEEE 802.20, long term evolution (LTE), Evolution-Data Optimized (Ev-DO), high-speed packet access plus (HSPA+), high-speed downlink packet access plus (HSDPA+), high-speed uplink packet access plus (HSUPA+), Enhanced Data GSM Evolution (EDGE), Global System for Mobile communication (GSM), Global Positioning System (GPS), General Packet Radio Service (GPRS), Code Division Multiple Access (CDMA), Time Division Multiple Access (TDMA), digital enhanced cordless communication (DECT), Bluetooth, third generation (3G), fourth generation (4G), fifth generation (5G), and any other wireless and wired protocols designated thereafter, but are not limited thereto.

One or more examples may provide a radio frequency (RF) switch that improves a withstanding voltage of the RF switch.

Additionally, in accordance with one or more embodiments, a transistor which has a low withstanding voltage may be implemented as the bias transistor by connecting a gate terminal of the bias transistor connected between the gate terminal and the body terminal of the switch transistor to a ground terminal so that a unit cost of the RF switch may be reduced.

An example RF switch, in accordance with one or more embodiments, will be described in detail with reference to the drawings.

FIG. 1 illustrates an example radio frequency (RF) switch that implements a general floating body bias method, in accordance with one or more embodiments.

Referring to FIG. 1, the RF switch 100 that implements the floating body bias method may include a switch transistor 110 and resistors $R_G$, $R_B$, and $R_{SD}$.

The switch transistor 110 may be connected between a first port P1 and a second port P2, and may switch an RF path formed between the first port P1 and the second port P2. When the switch transistor 110 is turned on, the first port P1 and the second port P2 may be connected to each other, and thus a radio frequency (RF) signal may be transmitted. When the switch transistor 110 is turned off, the first port P1 and the second port P2 may not be connected to each other, and thus the RF signal may be blocked. The switch transistor 110 may be implemented with a transistor such as a field effect transistor (FET), a bipolar transistor, or the like that performs a switching operation. In FIG. 1, the switch transistor 110 is shown as an N type transistor, but may be replaced with a P type transistor. Hereinafter, for convenience of description, it is assumed that the switch transistor 110 is an N-type FET. However, this is only an example, and the N-type FET t may be replaced with another transistor.

The switch transistor 110 may have a gate terminal G, a drain terminal D, a source terminal S, and a body terminal B. In an example, the gate terminal G may be a control terminal.

The drain terminal D of the switch transistor 110 may be connected to the first port P1, and the source terminal S of the switch transistor 110 may be connected to the second port P2. The gate terminal G of the switch transistor 110 may be connected to a first end of the resistor $R_G$, and a gate voltage VG may be applied to a second end of the resistor $R_G$. The gate voltage VG may have a positive voltage as a turn-on voltage of the switch transistor 110, and the gate voltage VG may have a negative voltage as a turn-off voltage of the switch transistor 110.

The gate voltage VG may be generated by a gate driving circuit (not shown). The gate driving circuit may generate a gate control signal, and may apply the gate voltage VG to turn on or turn off the switch transistor 110 to the gate terminal G of the switch transistor 110 according to the gate control signal.

The resistor $R_G$ is a gate resistor, and may prevent the RF signal from leaking to the gate terminal of the switch transistor 110 during an on or off operation of the switch transistor 110.

The body terminal B of the switch transistor 110 may be connected to a first end of the resistor $R_B$, and a bias voltage VB may be applied to a second end of the resistor $R_B$.

The bias voltage VB may have a voltage of 0 V or a negative voltage, the bias voltage VB may have 0 V when a turn-on voltage is applied to the gate terminal G of the switch transistor 110, and the bias voltage VB may have the negative voltage when a turn-off voltage is applied to the gate terminal G of the transistor 110.

The resistor $R_{SD}$ may be connected between the drain terminal D of the switch transistor 110 and the source terminal S of the switch transistor 110. The resistor $R_{SD}$ may maintain a direct current (DC) voltage between the drain terminal D and the source terminal S of the switch transistor 110 as the same voltage when the switch transistor 110 is turned off.

The RF switch 100 respectively connects the resistors $R_G$ and $R_B$ to the gate terminal G and the body terminal B to float the gate terminal G and the body terminal B so that a voltage of the gate terminal G and a voltage of the body terminal B change according to a voltage of the drain terminal D to which the RF signal is input. Accordingly, since an on/off state of the RF switch may be maintained, signal distortion may be prevented.

However, since there is a current leakage path between the body terminal B of the switch transistor 110 and a ground terminal, RF energy loss may occur.

Figure 2:
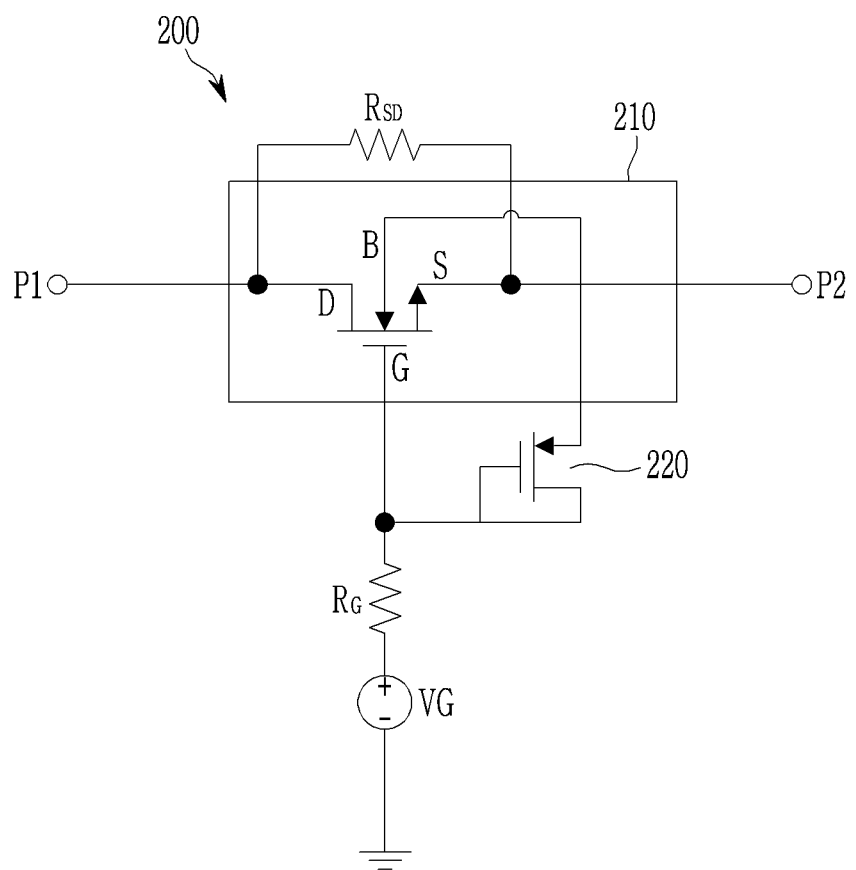
FIG. 2 illustrates an example RF switch implementing a general self-body bias method, in accordance with one or more embodiments.

FIG. 2 illustrates an RF switch that implements a general self-body bias method, in accordance with one or more embodiments.

Referring to FIG. 2, instead of applying a bias voltage to the body terminal B of the switch transistor 110 through the resistor $R_B$ as shown in FIG. 1, the RF switch 200 may include a diode-connected bias transistor 220 that is connected between a gate terminal G and a body terminal B. A switch transistor 210 and resistors $R_G$ and $R_{SD}$ are the same as those described in FIG. 1.

A bias voltage may be applied to the body terminal B of the switch transistor 110 in line with a voltage applied to the gate terminal G of the switch transistor 110. Accordingly, loss of RF power may be reduced, and the bias voltage of the body terminal B may be controlled so that a harmonic characteristic is improved.

Hereinafter, an embodiment that may improve a withstanding voltage of a RF switch by improving a body bias structure of the RF switch will be described.

Figure 3:
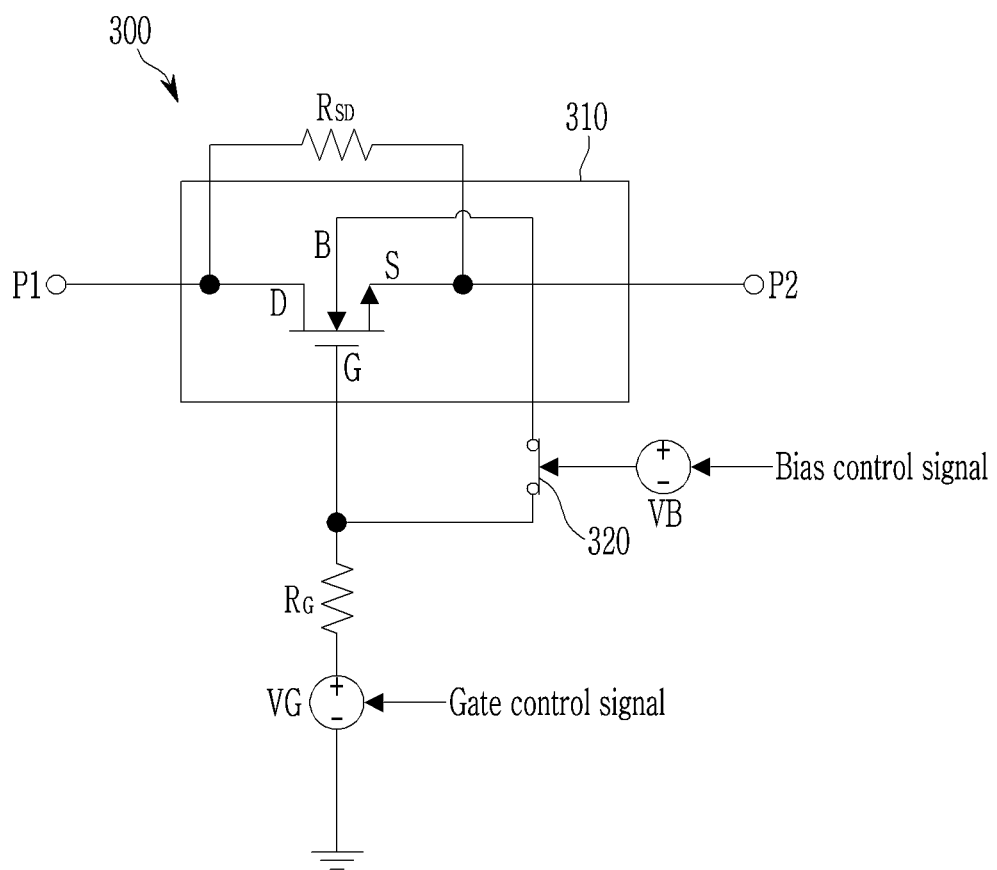
FIG. 3 illustrates an example radio frequency (RF) switch implementing a synchronous self-body bias method, in accordance with one or more embodiments.
Figure 4:
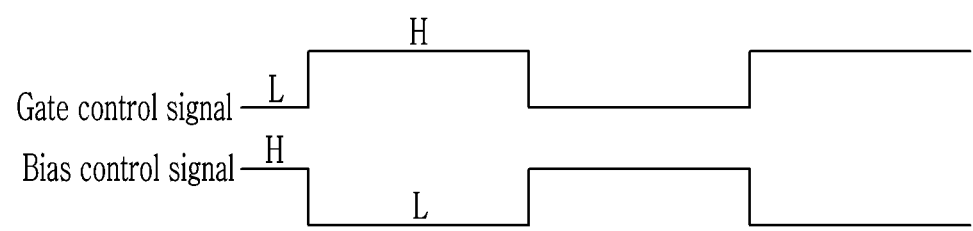
FIG. 4 illustrates timing of a gate control signal and a bias control signal shown in FIG. 3.

FIG. 3 illustrates an example radio frequency (RF) switch that implements a synchronous self-body bias method, in accordance with one or more embodiments, and FIG. 4 illustrates a timing of a gate control signal and a bias control signal illustrated in FIG. 3.

Referring to FIG. 3, the example RF switch 300 may include a switch transistor 310, a bias switch 320, and resistors $R_G$ and $R_{SD}$. The switch transistor 310 and the resistors $R_G$ and $R_{SD}$ may be the same as those described in FIG. 1. That is, the RF switch 300 may include a bias switch 320 connected between a gate terminal G of the switch transistor 310 and a body terminal B of the switch transistor 310, instead of the connected diode-connected bias transistor 220 of FIG. 2.

The bias switch 320 may be turned on or turned off according to a bias voltage VB. The bias voltage VB may have a turn-on voltage to turn on the bias switch 320 or a turn-off voltage to turn off the bias switch 320 according to the bias control signal. The turn-on voltage of the bias switch 320 may be a positive voltage, and the turn-off voltage of the bias switch 320 may be a negative voltage. In an example, the turn-on voltage of the bias switch 320 may be different from a turn-on voltage of the switch transistor 310, and the turn-off voltage of the bias switch 320 may be different from a turn-off voltage of the switch transistor 310. The bias voltage VB may be generated by a bias driving circuit (not shown in the drawings). The bias driving circuit may generate the bias control signal in synchronization with the gate control signal so that the bias switch 320 is turned off when the switch transistor 310 is turned on.

A turn-on operation or a turn-off operation of the bias switch 320 may be controlled according to an on/off state of the switch transistor 310, and the bias switch 320 may be turned on when the switch transistor 310 is turned off so that a negative gate voltage may be applied to the body terminal B of the switch transistor 310. That is, the bias control signal may be synchronized with the gate control signal, and may have an opposite phase to a phase of the gate control signal.

Specifically, referring to FIG. 4, the gate control signal has a high-level H and the bias control signal has a low-level L. Then, as a gate voltage VG becomes a positive voltage, a positive voltage is applied to the gate terminal G of the switch transistor 310 and the switch transistor 310 is turned on. On the one hand, the bias voltage VB becomes a negative voltage so that the bias switch 320 is turned off. When the bias switch 320 is turned off, the gate terminal G of the switch transistor 310 and the body terminal B of the switch transistor 310 are not connected.

Next, the gate control signal has a low-level L and the bias control signal has a high-level H. Then, as the gate voltage VG becomes a negative voltage, a negative voltage is applied to the gate terminal G of the switch transistor 310 and the switch transistor 310 is turned off. On the one hand, the bias voltage VB becomes a positive voltage so that the bias switch 320 is turned on. When the bias switch 320 is turned on, the same negative voltage is applied to the gate terminal G of the switch transistor 310 and the body terminal B of the switch transistor 310.

In general, a condition where the highest voltage is applied to the RF switch is when all transistors are off. In this example, a withstanding voltage of the RF switch may be improved by applying a negative voltage to the gate terminal G of the switch transistor 310 and the body terminal B of the switch transistor 310.

In an example of the RF switch 100 using the floating body bias method shown in FIG. 1, a potential of the body terminal B of the switch transistor 110 is not synchronized with a potential of the gate terminal G of the switch transistor 110 at all by applying a voltage to the body terminal B of the switch transistor 110 separately from the gate voltage applied to the gate terminal G of the switch transistor 110 so that a withstanding voltage characteristic is deteriorated.

Additionally, in an example of the RF switch 200 using the self-body bias method illustrated in FIG. 2, the gate terminal G of the switch transistor 210 and the body terminal B of the switch transistor 210 are connected, but a difference between a potential of the body terminal B of the switch transistor 210 and a potential of the gate terminal G of the switch transistor 210 occurs as much as a diode voltage drop of the diode-connected bias transistor 220. As a result, a voltage of the gate terminal G of the switch transistor 210 is not synchronized with a voltage of the body terminal B of the switch transistor 210 so that harm may occur to a withstanding voltage characteristic of the RF switch.

However, the RF switch 300 illustrated in FIG. 3 may connect the bias switch 320 between the gate terminal G of the switch transistor 310 and the body terminal B of the switch transistor 310 so that a voltage of the body terminal B of the switch transistor 310 is synchronized with a gate voltage of the gate terminal G of the switch transistor 310. That is, since the RF switch 300 shown in FIG. 3 may apply a synchronized negative voltage to the gate terminal G of the switch transistor 310 and the body terminal B of the switch transistor 310, a withstanding voltage characteristic of the RF switch may be improved compared to that of the RF switch of FIG. 2.

Figure 5:
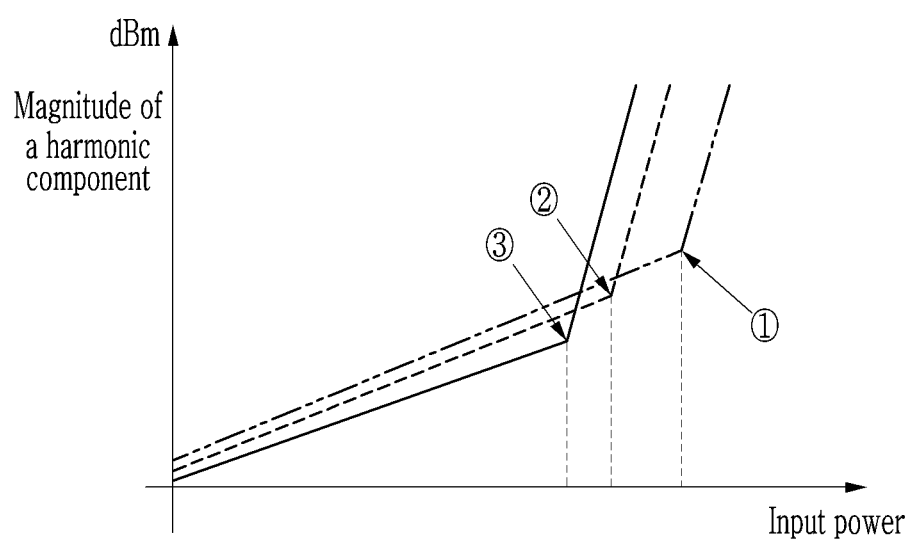
FIG. 5 is a graph diagram comparing withstanding voltages of the example RF switches illustrated in FIGS. 1 to 3.

FIG. 5 is a graph diagram comparing withstanding voltages of the RF switches illustrated in FIGS. 1 to 3.

Referring to FIG. 5, the withstanding voltage of the RF switch may be evaluated through a magnitude of a harmonic component output from the RF switch. FIG. 5 illustrates a third harmonic component. It may be determined that breakdown of the RF switch occurs at a time point at which linearity of the harmonic component output from the RF switch is broken, and it may be interpreted that the RF switch withstands power up to a time point at which linearity of the harmonic component output from the RF switch is broken. Accordingly, the withstanding voltages of the RF switches shown in FIGS. 1 to 3 may be compared through an input power at a time point at which linearity of the harmonic component output from each of the RF switches shown in FIGS. 1 to 3 is broken.

As shown in FIG. 5, it may be seen that the withstanding voltage of the RF switch may vary according to a body bias method.

Specifically, it may be seen that the RF switch ① using the synchronous self-body bias method shown in FIG. 3 has a higher withstanding voltage than the RF switch ③ using the floating body bias method shown in FIG. 1 and the RF switch ② using the self-body bias method shown in FIG. 2. This means that in order to secure the same withstanding voltage, the number of stacked transistors of the RF switch ① using the synchronous self-body bias method shown in FIG. 3 may be reduced compared to the number of stacked transistors of the RF switch ③ using the floating body bias method shown in FIG. 1 and the number of stacked transistors of the RF switch ② using the self-body bias method shown in FIG. 2.

That is, since the RF switch ① using the synchronous self-body bias method shown in FIG. 3 may reduce the number of stacked transistors compared to the RF switch ② or ③ shown in FIG. 1 or FIG. 2, an on-resistance of the RF switch may be reduced and a size of the RF switch may be reduced.

Next, in an example of the RF switch 300 using the synchronous self-body bias method shown in FIG. 3, the gate control signal and the bias control signal may be respectively used. Alternatively, a synchronized negative voltage may be applied to the gate terminal G of the switch transistor 310 and the body terminal B of the switch transistor 310 using only one control signal. This embodiment will be described in detail with reference to FIGS. 6 to 8.

Figure 6:
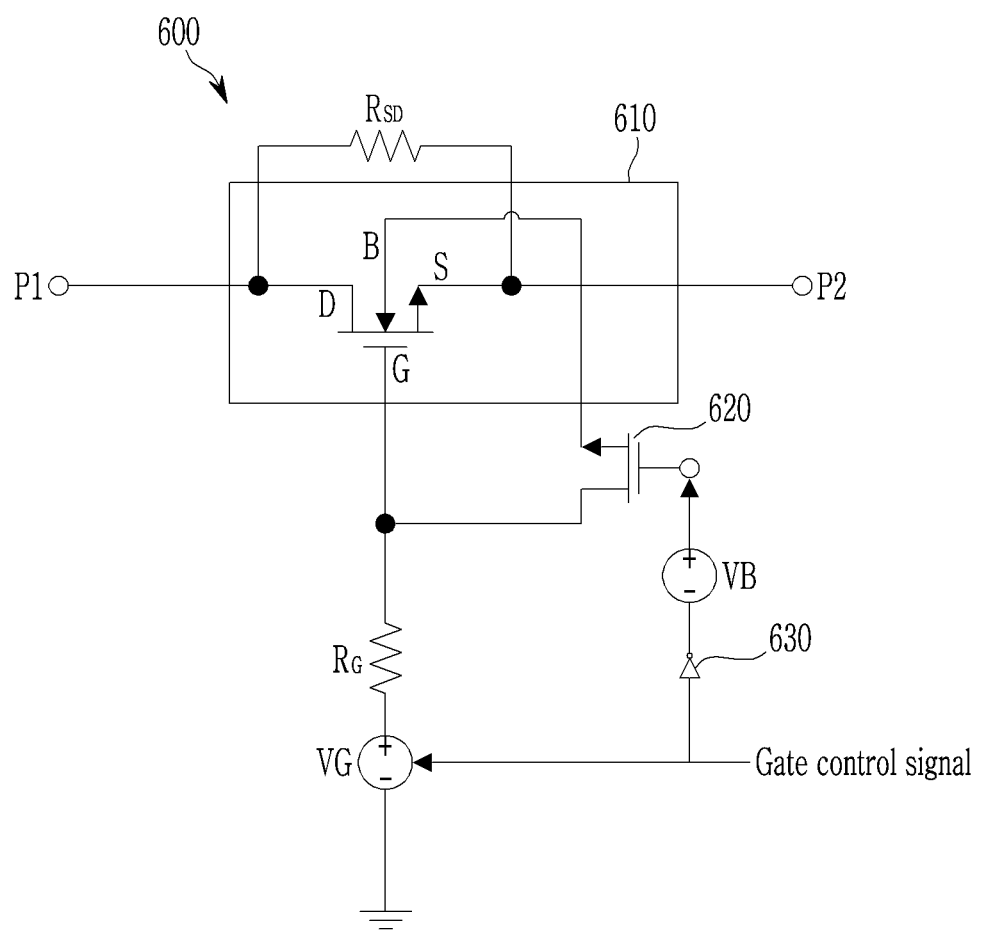
FIG. 6 illustrates an example RF switch that implements a synchronous self-body bias method, in accordance with one or more embodiments.

FIG. 6 is a view illustrating an example of the RF switch implementing the synchronous self-body bias method, in accordance with one or more embodiments.

Referring to FIG. 6, the RF switch 600 may use an N-type bias transistor 620 as the bias switch 320 shown in FIG. 3. In this example, the RF switch 600 may further include an inverter 630.

A drain terminal of the N-type bias transistor 620 is connected to a gate terminal G of the switch transistor 610, and a source terminal of the N-type bias transistor 620 is connected to a body terminal B of the switch transistor 610. A gate terminal of the N-type bias transistor 620 is connected to an output terminal of the inverter 630.

A gate voltage VG may have a positive voltage as a turn-on voltage of the switch transistor 610 according to a level of a gate control signal, and may have a negative voltage as a turn-off voltage of the switch transistor 610.

The gate control signal may be input to an input terminal of the inverter 630. The inverter 630 inverts the gate control signal and outputs the inverted signal. A bias voltage VB may have a turn-off voltage (for example, a negative voltage) of the N-type bias transistor 620 according to the gate control signal inverted by the inverter 630, or the bias voltage VB may have a turn-on voltage (for example, a positive voltage) of the N-type bias transistor 620 according to the inverted gate control signal inverted by the inverter 630.

Specifically, when the gate control signal has a high level, the gate voltage VG becomes a positive voltage so that the positive voltage is applied to the gate terminal G of the switch transistor 610 and the switch transistor 610 is turned on. At the same time, since the gate control signal becomes a low level through the inverter 630, the bias voltage VB becomes a negative voltage so that the N-type bias transistor 620 is turned off.

On the other hand, when the gate control signal has a low level, the gate voltage VG becomes a negative voltage so that the negative voltage is applied to the gate terminal G of the switch transistor 610 and the switch transistor 610 is turned off. At the same time, since the gate control signal becomes a high level through the inverter 630, the bias voltage VB becomes a positive voltage so that the N-type bias transistor 620 is turned on. Accordingly, a negative voltage is applied to the body terminal B of the switch transistor 610 in an off state of the switch transistor 610.

That is, the RF switch 600 may apply the same negative voltage to the gate terminal G of the switch transistor 610 and the body terminal B of the switch transistor 610 in an off state of the switch transistor 610 like the RF switch 300 shown in FIG. 3 using only one gate control signal.

Figure 7:
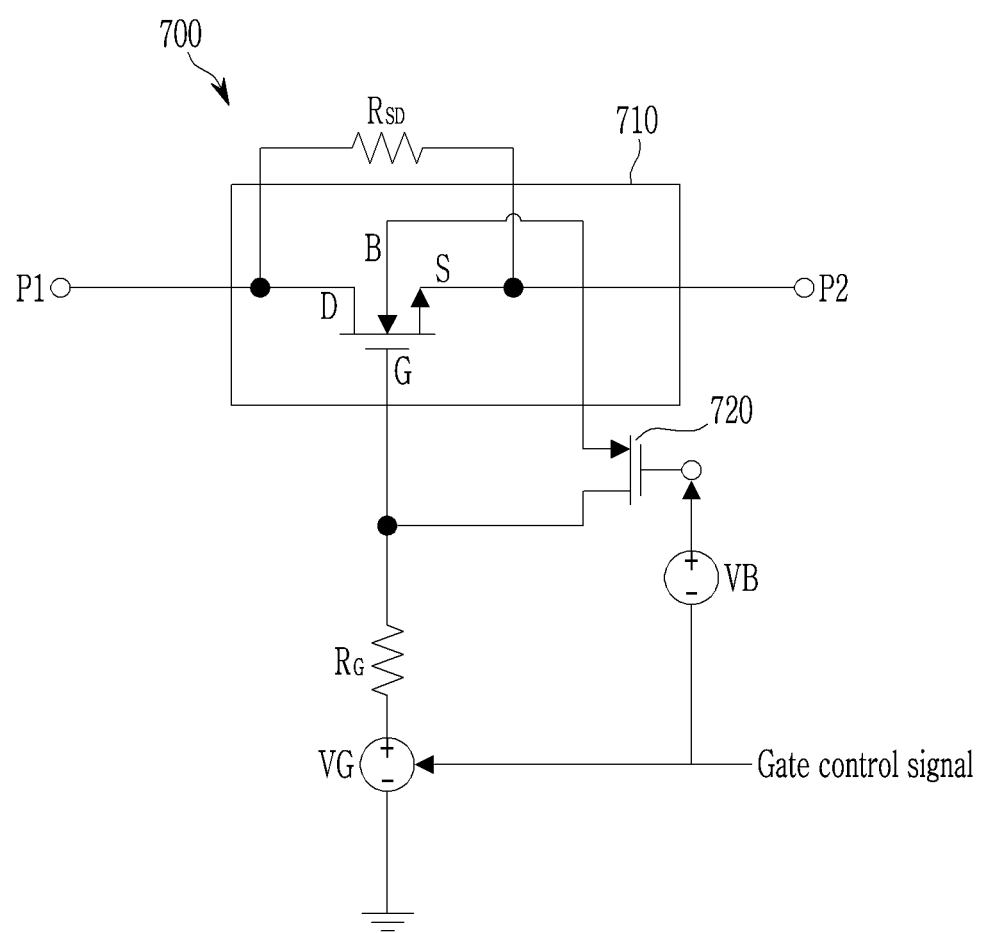
FIG. 7 illustrates an example RF switch that implements a synchronous self-body bias method, in accordance with one or more embodiments.

FIG. 7 is a view illustrating an example RF switch implementing the synchronous self-body bias method, in accordance with one or more embodiments.

Referring to FIG. 7, the RF switch 700 may use a P-type bias transistor 720 as the bias switch 320 illustrated in FIG. 3. In this example, a gate voltage VG and a bias voltage VB may have a positive voltage or a negative voltage according to a gate control signal. Unlike an N-type switch transistor 710, the P-type bias transistor 720 may have a negative voltage as a turn-on voltage and a positive voltage as a turn-off voltage.

Since the switch transistor 710 is an N type and the bias transistor 720 is a P type, the gate voltage VG becomes a positive voltage when the gate control signal has a high level so that a positive voltage is applied to a gate terminal G of the switch transistor 710 and the switch transistor 710 is turned on. At the same time, the bias voltage VB also becomes a positive voltage so that the P-type bias transistor 720 is turned off.

On the other hand, when the gate control signal has a low level, the gate voltage VG becomes a negative voltage so that a negative voltage is applied to the gate terminal G of the switch transistor 710 and the switch transistor 710 is turned off. At the same time, the bias voltage VB also becomes a negative voltage so that the P-type bias transistor 720 is turned on. Accordingly, a negative voltage is applied to a body terminal B of the switch transistor 710 in an off state of the switch transistor 710.

That is, the RF switch 700 may apply the same negative voltage to the gate terminal G of the switch transistor 710 and the body terminal B of the switch transistor 710 in an off state of the switch transistor 710 like the RF switch 300 shown in FIG. 3 using only one gate control signal.

Figure 8:
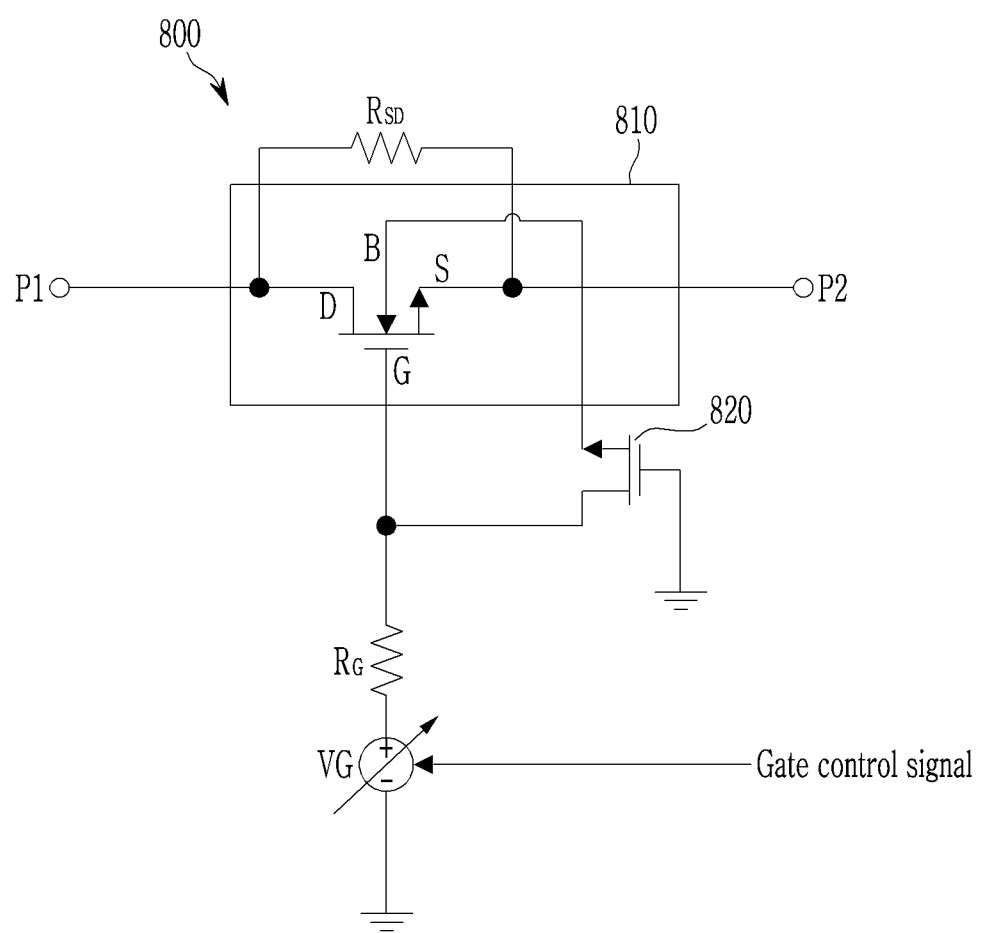
FIG. 8 illustrates an example RF switch that implements a synchronous self-body bias method, in accordance with one or more embodiments.

FIG. 8 illustrates an example e RF switch using the synchronous self-body bias method, in accordance with one or more embodiments.

Referring to FIG. 8, the RF switch 800 may use an N-type bias transistor 820 as the bias switch 320 illustrated in FIG. 3. In this example, unlike FIG. 6, a gate terminal of the N-type bias transistor 820 may be connected to a ground terminal. A drain terminal and a source terminal of the N-type bias transistor 820 may be configured as symmetrical elements.

The source terminal of the N-type bias transistor 820 may be connected to a gate terminal G of the switch transistor 810, and the drain terminal of the N-type bias transistor 820 may be connected to a body terminal B of the switch transistor 810. The bias transistor 820 in which the drain terminal and the source terminal are composed of symmetric elements has no difference in operation even if positions of the source terminal and the drain terminal are changed.

When a gate control signal has a high level, a gate voltage VG becomes a positive voltage so that a positive voltage is applied to the gate terminal G of the switch transistor 810 and the switch transistor 810 is turned on. At the same time, a positive voltage is applied to the source terminal of the N-type bias transistor 820, and a ground voltage is applied to the gate terminal of the N-type bias transistor 820. Then, a voltage between the gate terminal and the source terminal of the N-type bias transistor 820 becomes a negative voltage and becomes lower than a threshold voltage of the N-type bias transistor 820 so that the N-type bias transistor 820 is turned off.

On the other hand, when the gate control signal has a low level, the gate voltage VG becomes a negative voltage so that a negative voltage is applied to the gate terminal G of the switch transistor 810 and the switch transistor 810 is turned off. At the same time, a negative voltage is applied to the source terminal of the N-type bias transistor 820, and a ground voltage is applied to the gate terminal of the N-type bias transistor 820. Then, the voltage between the gate terminal and the source terminal of the N-type bias transistor 820 is greater than the threshold voltage of the N-type bias transistor 820 so that the N-type bias transistor 820 is turned on. Therefore, a negative voltage is applied to the body terminal B of the switch transistor 810 in a turned-off state of the switch transistor 810.

That is, the RF switch 800 may apply the same negative voltage to the gate terminal G of the switch transistor 810 and the body terminal B of the switch transistor 810 in an off state of the switch transistor 810, similar to the RF switch 300 illustrated in FIG. 3 by using only one gate control signal.

Additionally, the RF switch 800 illustrated in FIG. 8 may connect the gate terminal of the N-type bias transistor 820 to the ground terminal so that the RF switch 800 uses a transistor having a lower withstanding voltage than the N-type bias transistor 620 of the RF switch 600 illustrated in FIG. 6 as the N-type bias transistor 820. For example, it is assumed that the gate voltage VG has 3 V as a turn-on voltage of the switch transistor 610 and the gate voltage VG has −3 V as a turn-off voltage of the switch transistor 610. It is also assumed that the bias voltage VB has 3 V as a turn-on voltage of the bias transistor 620 and the bias voltage VB has −3 V as a turn-off voltage of the bias transistor 620. In an example of the RF switch 600 illustrated in FIG. 6, when −3 V is applied to the gate terminal G of the switch transistor 610 so that the switch transistor 610 is turned off, 3V may be applied to the gate terminal of the bias transistor 620 so that the bias transistor 620 is turned on. In this example, −3 V may be applied to the drain terminal of the bias transistor 620. Accordingly, a voltage difference between the gate terminal of the bias transistor 620 and the drain terminal of the bias transistor 620 becomes 6 V. On the other hand, in an example of the RF switch 800 illustrated in FIG. 8, when −3 V is applied to the gate terminal G of the switch transistor 810 so that the switch transistor 810 is turned off, 0 V may be applied to the gate terminal of the transistor 820 so that the bias transistor 820 is turned on. Accordingly, a voltage difference between the gate terminal of the bias transistor 820 and the drain terminal of the bias transistor 820 becomes 3 V. As described above, a voltage difference between the gate terminal of the bias transistor 820 and the drain terminal of the bias transistor 820 when the switch transistor 810 of the RF switch 800 shown in FIG. 8 is turned off may be smaller than a voltage difference between the gate terminal of the bias transistor 620 and the drain terminal of the bias transistor 620 when the switch transistor 610 of the RF switch 600 shown in FIG. 6 is turned off. Therefore, the bias transistor 820 of the RF switch 800 illustrated in FIG. 8 may be used as a transistor having a lower withstanding voltage than the N-type bias transistor 620 of the RF switch 600 shown in FIG. 6.

Figure 9:
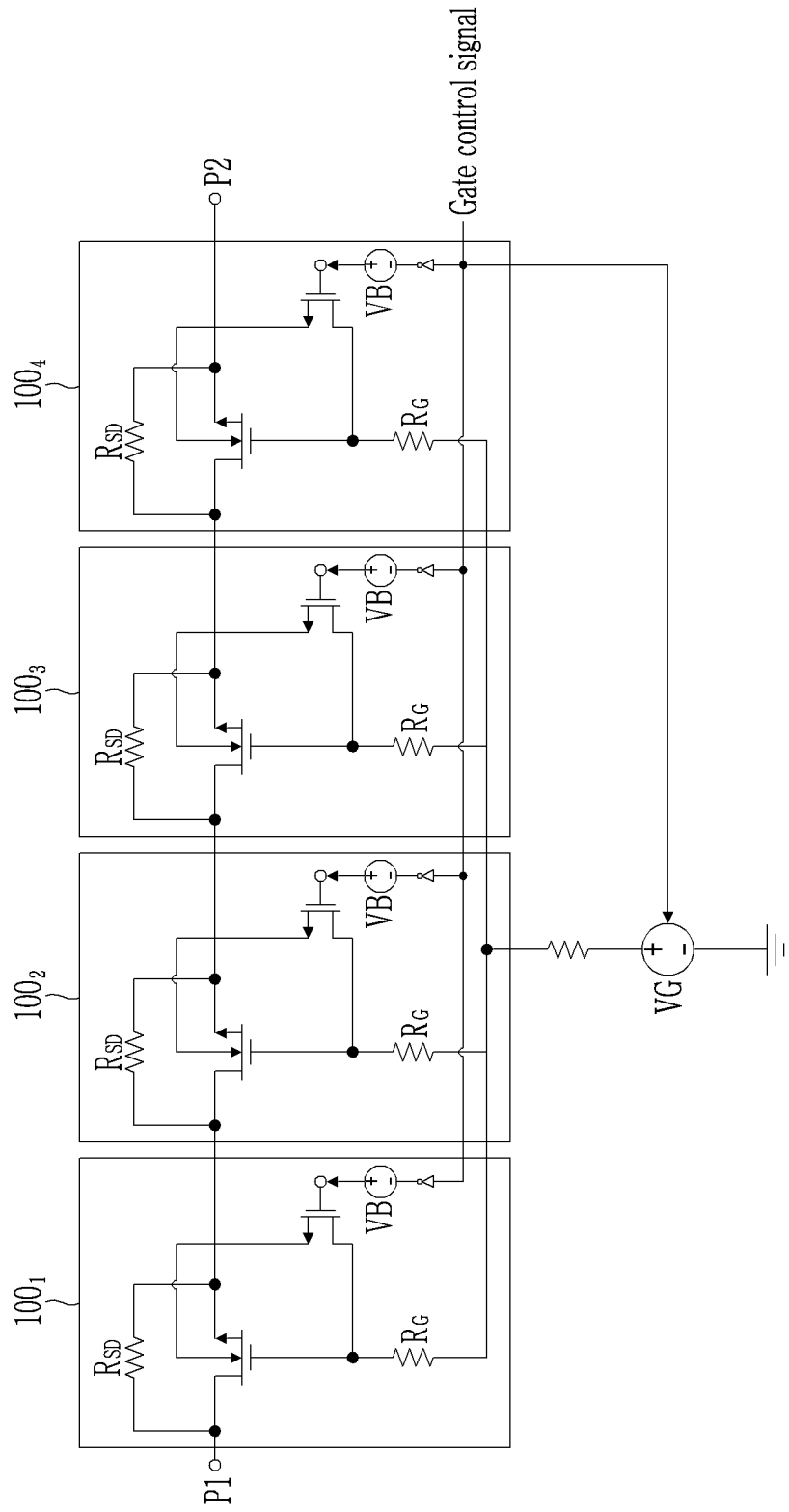
FIG. 9 illustrates a stacked structure of the example RF switch shown in FIG. 6.
Figure 10:
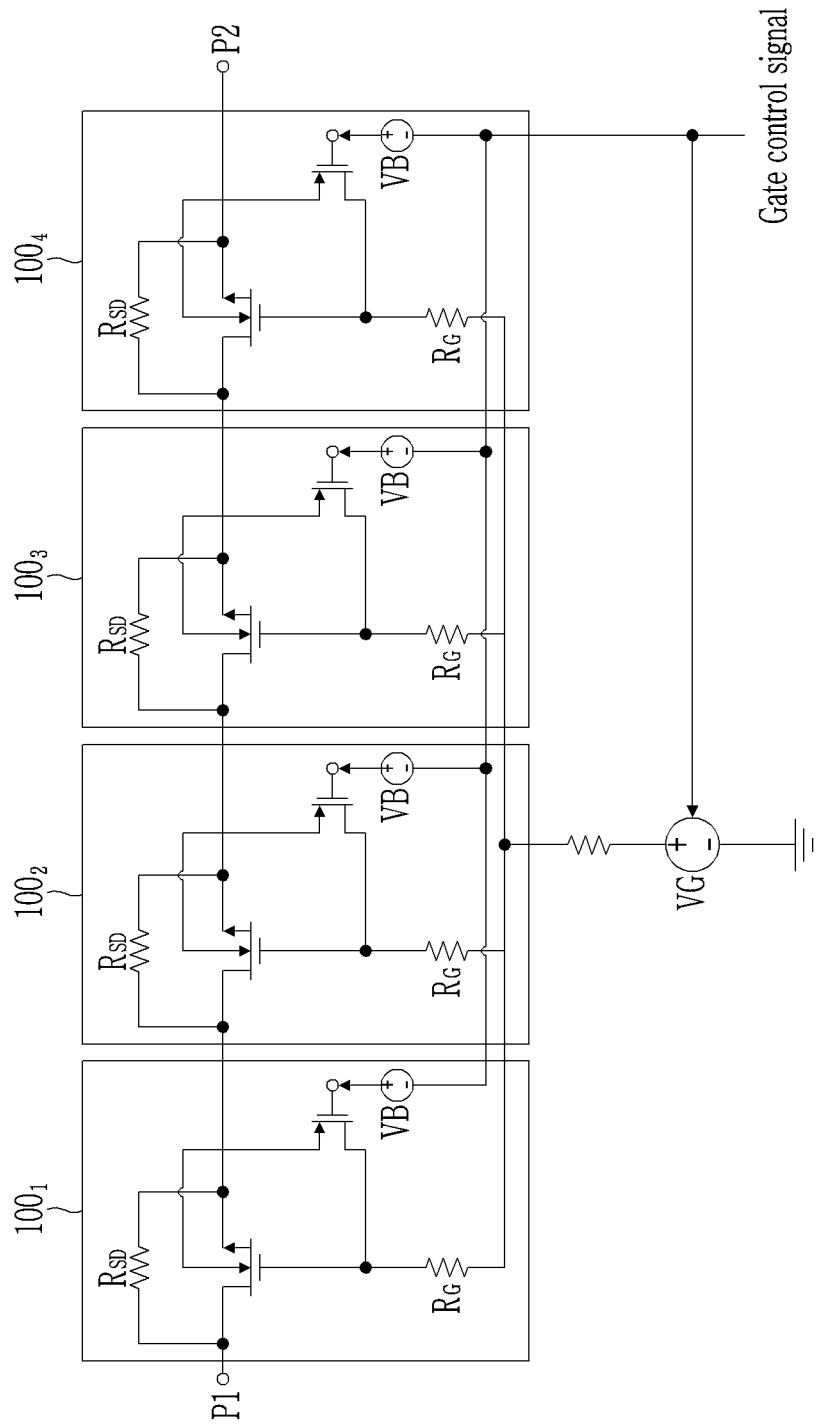
FIG. 10 illustrates a stacked structure of the example RF switch shown in FIG. 7.
Figure 11:
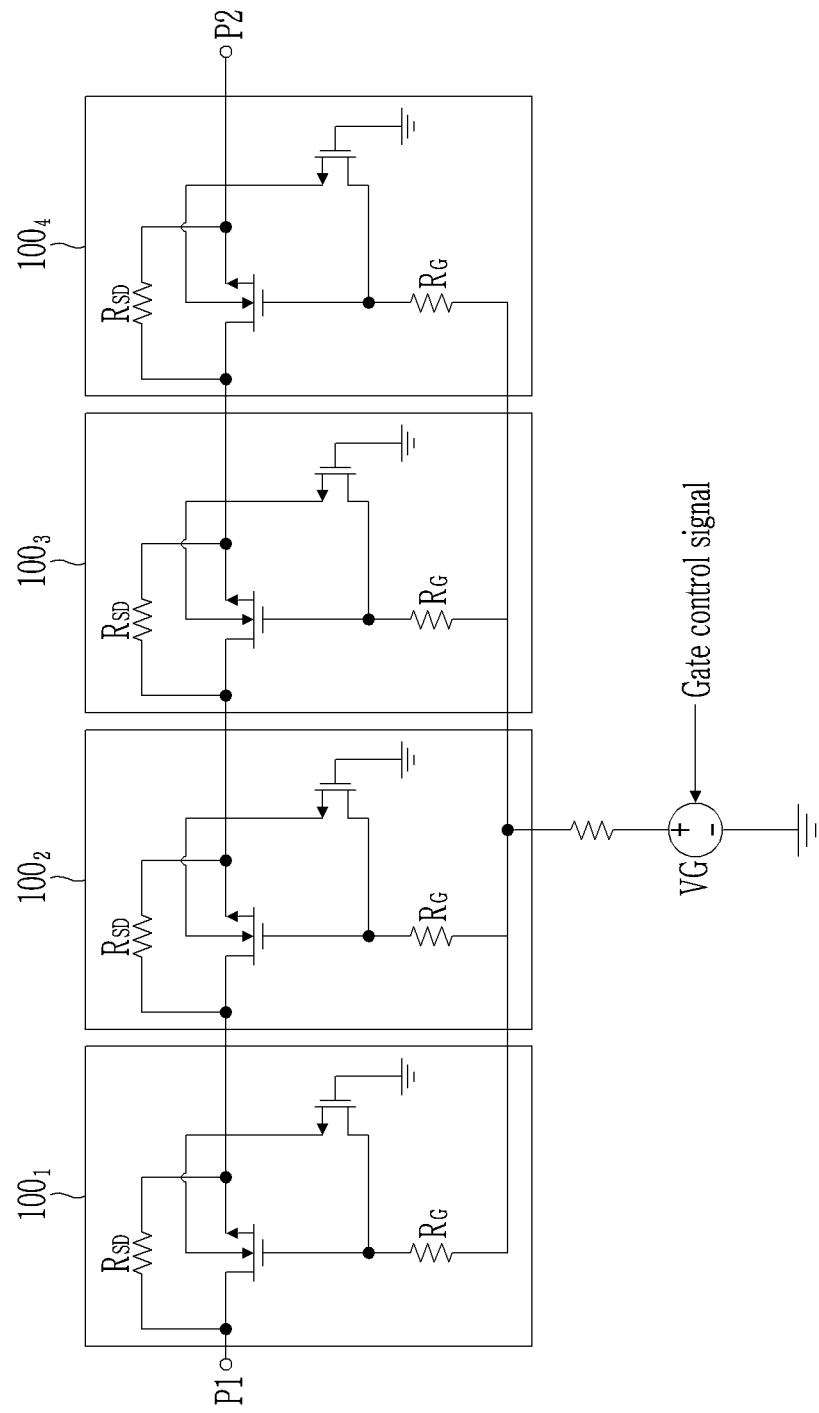
FIG. 11 illustrates a stacked structure of the example RF switch shown in FIG. 8.

FIG. 9 illustrates an example of a stacked structure of the RF switch shown in FIG. 6, FIG. 10 illustrates an example of a stacked structure of the RF switch shown in FIG. 7, and FIG. 11 illustrates an example of a stacked structure of the RF switch shown in FIG. 8.

Referring to FIGS. 9 to 11, in order to secure a high withstanding voltage, several RF switches $100_1$, $100_2$, $100_3$, and $100_4$ may be connected in series between a first port P1 and a second port P2. As illustrated in FIG. 9, in an example, the RF switch $100_1$, $100_2$, $100_3$, or $100_4$ may be configured as the RF switch 600 illustrated in FIG. 6, and as illustrated in FIG. 10, in an example, the RF switch $100_1$, $100_2$, $100_3$, or $100_4$ may be configured as the RF switch 700 illustrated in FIG. 7. Additionally, as illustrated in FIG. 11, in an example, the RF switch $100_1$, $100_2$, $100_3$, or $100_4$ may be configured as the RF switch 800 illustrated in FIG. 8. FIGS. 9 to 11 illustrate that the number of stacked RF switches is four. However, this is only an example, and the one or more embodiments are not limited thereto.

In FIGS. 9 to 11, a gate voltage VB may be commonly applied to the RF switches $100_1$, $100_2$, $100_3$, and $100_4$.

Additionally, in the example of FIG. 9, inverters included in the RF switches $100_1$, $100_2$, $100_3$, and $100_4$ may be replaced with one common inverter. That is, a bias voltage VB according to a gate control signal inverted by the one common inverter may be commonly applied to a gate electrode of a bias transistor within each of the RF switches $100_1$, $100_2$, $100_3$, and $100_4$. Thus, a circuit structure illustrated in FIG. 9 may be simplified.

As described above, by stacking or configuring several RF switches $100_1$, $100_2$, $100_3$, and $100_4$ in series between the first port P1 and the second port P2, an RF switch having a high withstanding voltage may be implemented.

Additionally, a serial stacking structure of the RF switches $100_1$, $100_2$, $100_3$, and $100_4$ may be applied between the first port P1 and the second port P2 as illustrated in FIGS. 9 to 11, but may also be applied between a predetermined node between the first port P1 and second port P2 and a ground. This embodiment is illustrated in FIGS. 12 to 14.

Figure 12:
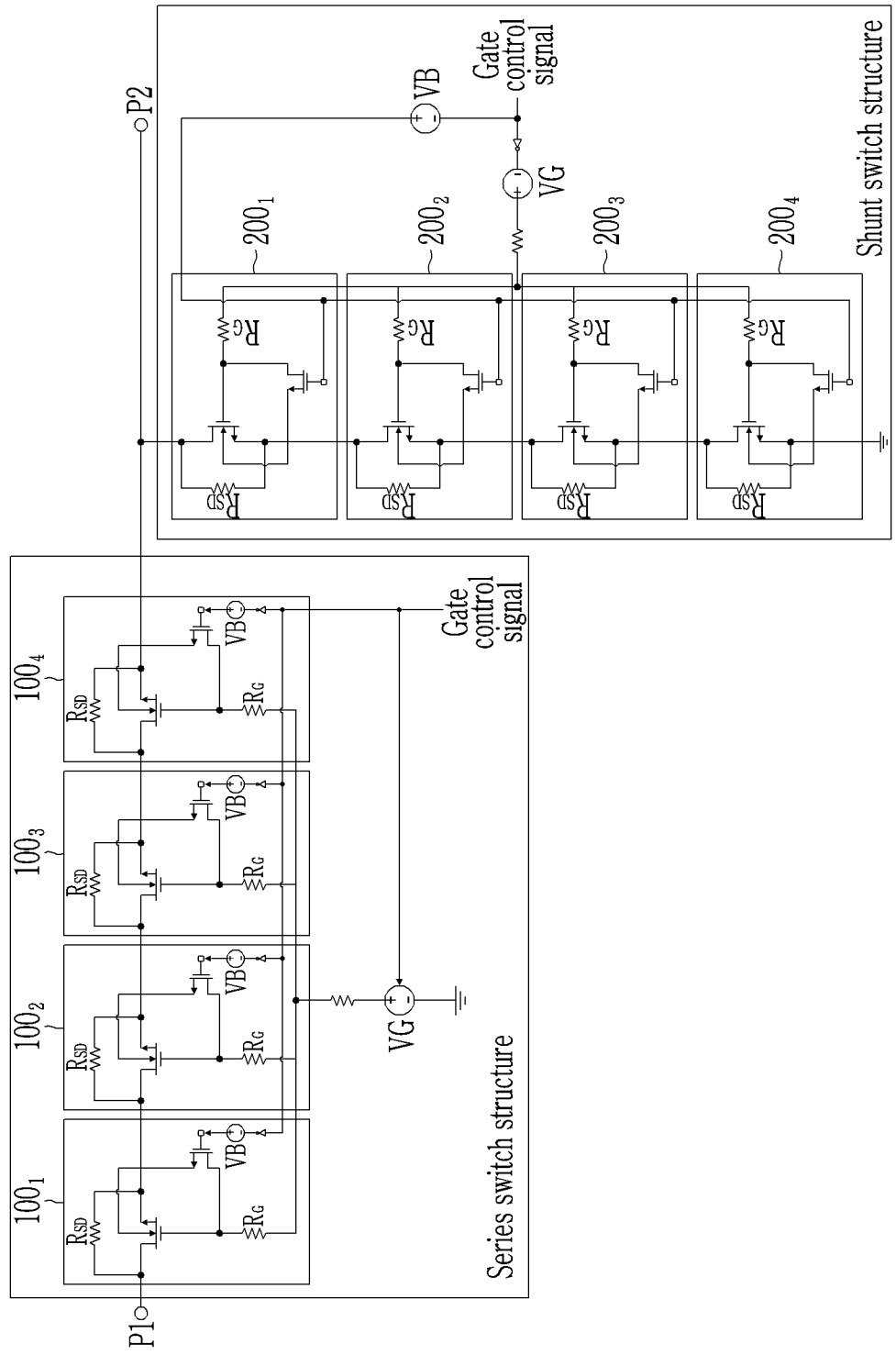
FIG. 12 illustrates an example of a stacked structure of the example RF switch shown in FIG. 6.
Figure 13:
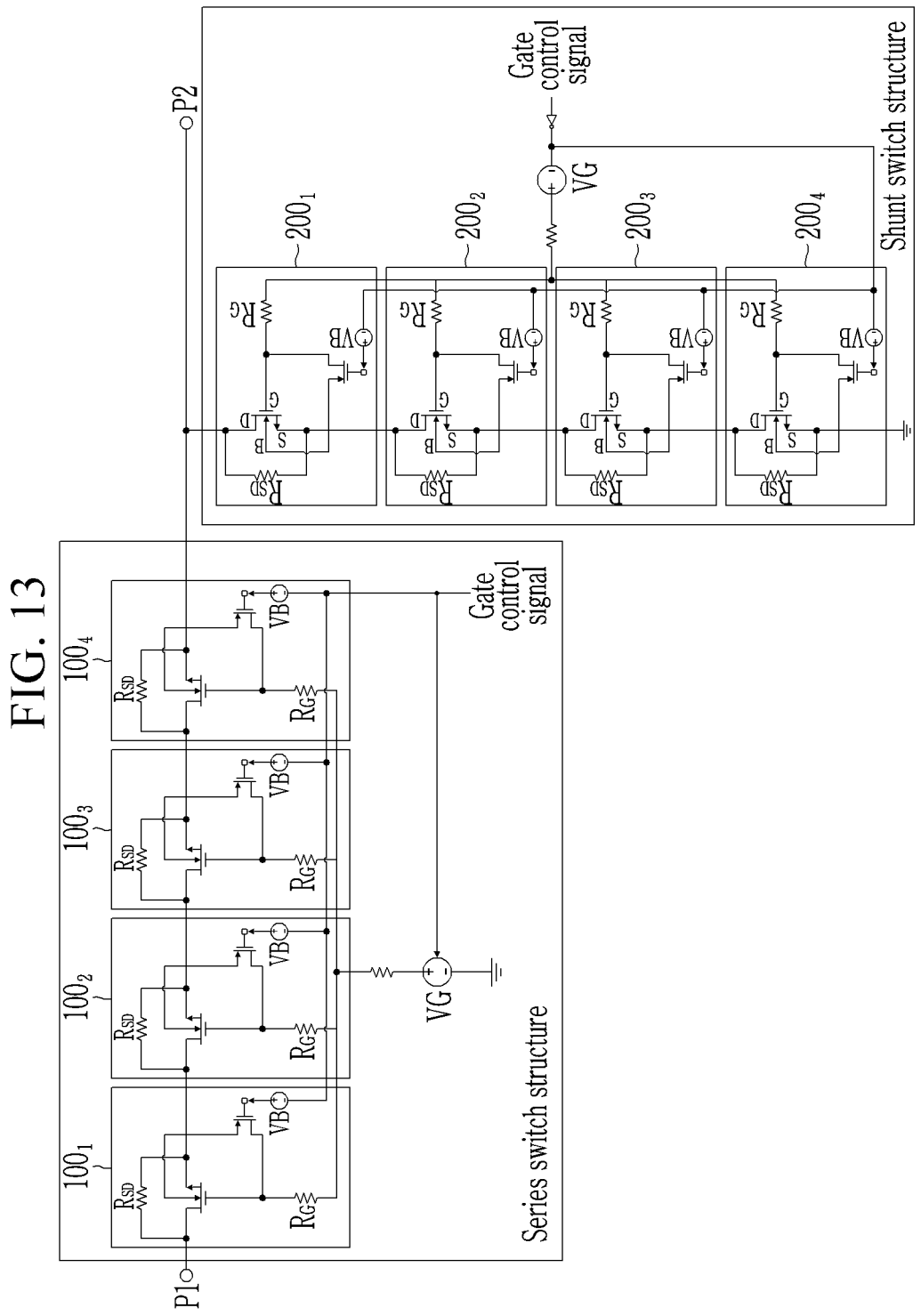
FIG. 13 illustrates an example of a stacked structure of the example RF switch shown in FIG. 7.
Figure 14:
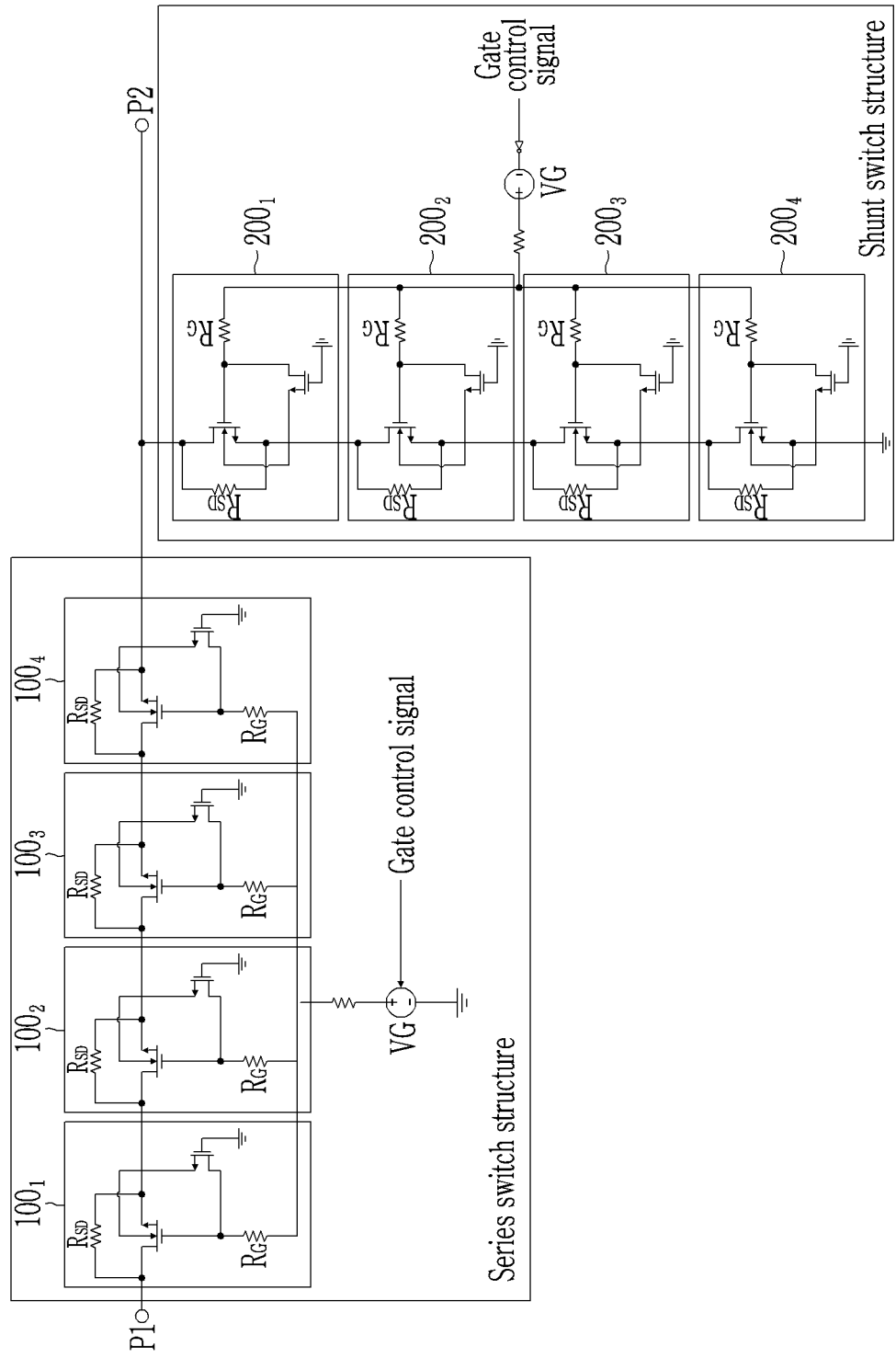
FIG. 14 illustrates an example of a stacked structure of the example RF switch shown in FIG. 8.

FIG. 12 illustrates an example of a stacked structure of the RF switch illustrated in FIG. 6, FIG. 13 is a view illustrating an example of a stacked structure of the RF switch illustrated in FIG. 7, and FIG. 14 is a view illustrating an example of a stacked structure of the RF switch illustrated in FIG. 8.

Referring to FIGS. 12 to 14, several RF switches $100_1$, $100_2$, $100_3$, and $100_4$ may be connected in series between the first port P1 and the second port P2. Additionally, several RF switches $200_1$, $200_2$, $200_3$, and $200_4$ may be connected in series to form a shunt switch structure between the second port P2 and the ground.

As illustrated in FIG. 12, the RF switches $100_1$, $100_2$, $100_3$, and $100_4$ and the RF switches $200_1$, $200_2$, $200_3$, and $200_4$ may be configured as the RF switch 600 illustrated in FIG. 6, and as illustrated in FIG. 13, the RF switches $100_1$, $100_2$, $100_3$, and $100_4$ and the RF switches $200_1$, $200_2$, $200_3$, and $200_4$ may be configured as the RF switch 700 illustrated in FIG. 7. Additionally, as illustrated in FIG. 14, the RF switches $100_1$, $100_2$, $100_3$, and $100_4$ and the RF switches $200_1$, $200_2$, $200_3$, and $200_4$ may be configured as the RF switch 800 illustrated in FIG. 8.

As illustrated in FIGS. 12 to 14, in an example of RF switches having a series switch structure and the shunt switch structure, a switch transistor of the RF switches $100_1$, $100_2$, $100_3$, and $100_4$ having the series switch structure is turned on and a switch transistor of the RF switches $200_1$, $200_2$, $200_3$, and $200_4$ having the shunt switch structure is turned off when an RF signal is transferred from the first port P1 to the second port P2. Additionally, when the RF signal is blocked from being transmitted to the second port P2, the switch transistor of the RF switches $100_1$, $100_2$, $100_3$, and $100_4$ having the series switch structure is turned off and the switch transistor of the RF switches $200_1$, $200_2$, $200_3$, and $200_4$ having the shunt switch structure is turned on.

For this operation, an inverter that inverts a gate control signal applied to the switch transistor of the RF switches $100_1$, $100_2$, $100_3$, and $100_4$ having the series switch structure may be added to the shunt switch structure.

In the example of FIG. 12, an inverter may be disposed within each of the RF switches $100_1$, $100_2$, $100_3$, and $100_4$. Additionally, since the inverter that inverts the gate control signal may be added to the shunt switch structure, the same effect as not using an inverter may be obtained when the inverter that inverts the gate control signal is connected to the inverter in the RF switches $100_1$, $100_2$, $100_3$, and $100_4$.

Therefore, in the shunt switch structure, it is possible to remove the inverter in the RF switches $100_1$, $100_2$, $100_3$, and $100_4$, and a bias voltage VB may be determined according to the gate control signal so that the determined bias voltage is applied to a gate terminal of a bias transistor.

While this disclosure includes specific examples, it will be apparent to one of ordinary skill in the art, after an understanding of the disclosure of this application, that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

What is claimed is:

1. A radio frequency (RF) switch, comprising:
   a switch transistor comprising a first terminal to which a radio frequency (RF) signal is input, a second terminal to which the RF signal is output, a control terminal to which a first level voltage and a second level voltage are applied in response to a control signal, and a body terminal to which a bias voltage is applied; and
   a bias switch, connected between the control terminal and the body terminal of the switch transistor, and configured to turn on when the switch transistor is turned off to apply the second level voltage to the body terminal,
   wherein a control terminal of the bias switch is connected to a ground terminal.

2. The RF switch of claim 1, wherein the second level voltage is a negative voltage.

3. The RF switch of claim 1, wherein each of the switch transistor and the bias switch is an N-type field effect transistor (FET).

4. A radio frequency (RF) switch, comprising:
   a plurality of first switch transistors, connected in series between a first port and a second port, the plurality of first switch transistors comprising:
   a first drain terminal to which a radio frequency (RF) signal is input, a first source terminal to which the RF signal is output, a first gate terminal to which at least one of a positive voltage and a negative voltage is applied in response to a gate control signal, and a first body terminal to which a bias voltage is applied; and
   a plurality of first bias switches connected between the first gate terminal and the first body terminal of each of the plurality of first switch transistors,
   wherein the plurality of first bias switches are configured to turn on when the plurality of first switch transistors are turned off and apply the negative voltage to the first body terminal, and
   wherein gate terminals of the plurality of first bias switches are connected to a ground terminal.

5. The RF switch of claim 4, wherein the plurality of first switch transistors and the plurality of first bias switches are N-type field effect transistors (FETs).

6. The RF switch of claim 4, further comprising a plurality of second switch transistors that are connected in series between the second port and a ground, and that are configured to turn off when the plurality of first switch transistors are turned on.

7. The RF switch of claim 6, further comprising a plurality of second bias switches that are connected between a second gate terminal and a second body terminal of each of the plurality of second switch transistors and that are configured to apply the negative voltage to the second body terminal when the plurality of second bias switches are turned on when the plurality of second switch transistors are turned off,
   wherein the plurality of second switch transistors respectively include a second drain terminal, a second source terminal, the second gate terminal to which the negative voltage or the positive voltage is applied in response to an inversion signal of the gate control signal, and the second body terminal.

8. A radio frequency (RF) switch, comprising:
   a first switch including a gate terminal, a source terminal, and a body terminal;
   a second switch, connected between the gate terminal of the first switch, the body terminal of the first switch, and configured to turn on based on an off state of the first switch,
   wherein, in response to a control signal, the RF switch is configured to transmit a negative voltage to the body terminal and the gate terminal of the first switch when the first switch is turned off,
   wherein a gate terminal of the second switch is connected to a ground terminal.

9. The RF switch of claim 8, wherein the first switch is an N-type field effect transistor (FET) and the second switch is an N-type FET.

* * * * *